United States Patent [19]

Cunningham et al.

[11] Patent Number: 4,980,892
[45] Date of Patent: Dec. 25, 1990

[54] OPTICAL SYSTEM INCLUDING WAVELENGTH-TUNABLE SEMICONDUCTOR LASER

[75] Inventors: John E. Cunningham, Lincroft; Timothy D. Harris, Toms River; Erdmann F. Schubert, New Providence; Jan P. van der Ziel, Short Hills, all of N.J.

[73] Assignee: AT&T Bell Laboratories, Murray Hill, N.J.

[21] Appl. No.: 358,972

[22] Filed: May 30, 1989

[51] Int. Cl.$^5$ ............................................. H01S 3/19
[52] U.S. Cl. ...................................... 372/45; 372/20; 372/50
[58] Field of Search ................... 372/20, 44, 45, 46, 372/50, 70

[56] References Cited

U.S. PATENT DOCUMENTS 4,839,899  6/1989  Burnham et al. ..................... 372/20

OTHER PUBLICATIONS

B. Brobert et al., "Widely Tunable Bragg Reflector Integrated Lasers in InGaAsp-InP," *Applied Physics Lett.* 52(16), Apr. 18, 1988, pp. 1285-1287.

G. H. Döhler, "Doping Superlattices" (n-i-p-i Crystals), *IEEE Journal of Quantum Electronics*, vol. QE-22, No. 9, Sep. 1986, pp. 1682-1694.

E. F. Schubert et al., "GaAs Sawtooth Superlattice Laser Emitting at Wavelengths $\lambda > 0.9$ um," *Applied Physics Letters*, vol. 47, No. 3, Aug. 1, 1985, pp. 219-221.

B. A. Vojak et al., "Photopumped Laser Operation of GaAs Doping Superlattices," *Applied Physics Letters*, vol. 48, No. 3, Jan. 20, 1986, pp. 251-253.

*Primary Examiner*—James W. Davie
*Attorney, Agent, or Firm*—Bernard Tiegerman; Glenn E. Books

[57] ABSTRACT

Optical systems which include a particular type of wavelength-tunable semiconductor laser are disclosed. Significantly, the active layer of the laser includes a doping superlattice layer. Even more significantly, wavelength-tunability is achieved by nonuniformly, optically and/or electrically pumping the laser.

5 Claims, 3 Drawing Sheets

OPTICAL SYSTEM INCLUDING WAVELENGTH-TUNABLE SEMICONDUCTOR LASER

BACKGROUND OF THE INVENTION

1. Field of the Invention

The invention pertains generally to optical systems, e.g., optical fiber communication systems, which include one or more wavelength-tunable semiconductor lasers.

2. Background of the Invention

Wavelength-tunable semiconductor lasers are considered desirable for use in a number of different types of optical systems. For example, optical fiber communication systems employing wavelength division multiplexing (WDM) necessarily include a plurality of light sources, typically semiconductor lasers, which emit optical signals at different wavelengths. In addition, it has been proposed that the stations of local area networks (LANs) communicating via optical fiber buses employ semiconductor lasers which emit different-wavelength laser radiation, the different wavelengths serving to identify the stations. The different wavelengths employed in these optical systems can be achieved by, for example, using semiconductor lasers having active layers with different material compositions. However, the fabrication of such lasers introduces undesirable complexity into the manufacturing process. By contrast, such complexity is avoided by using semiconductor lasers which are compositionally identical, but wavelength-tunable, hence the desirablility of tunable lasers.

Distributed feedback (DFB) and distributed Bragg reflector (DBR) semiconductor lasers are wavelength-tunable, and thus useful in the above-described optical systems. However, the maximum reported tuning range of, for example, DBR semiconductor lasers is only 116 Angstroms. (See Bjorn Brobert et al, "Widely Tunable Bragg Reflector Integrated Lasers in InGaAsP-InP," *Applied Physics Letters*, 52(16), Apr. 18 1988, pp. 1285-1287.) As a result, the number of different wavelength signals which can be employed in a WDM optical system, as well as the number of stations in a LAN emitting signals at different wavelengths, is limited. Consequently, tunable semiconductor lasers having tuning ranges greater than 116 Angstroms have been sought.

A new semiconductor laser which, it was hoped, would be wavelength-tunable includes an active layer which consists of a so-called doping superlattice, also called a n-i-p-i crystal. That is, the active layer is crystalline in nature, and has a composition which typically includes III-V compound semiconductor material, e.g., GaAs. In addition, the active layer includes periodically spaced sheets (layers) of n-type and p-type dopant, having delta function-like doping profiles (in the direction of the growth axis of the active layer), separated by intrinsic semiconductor material. The presence of the dopant sheets produces a sawtooth-shaped modulation of the energy band diagram associated with the intrinsic semiconductor material. (Regarding doping superlattices see, e.g., G. H. Dohler, "Doping Superlattices ("n-i-p-i Crystals")," *IEEE Journal of Quantum Electronics*, Vol. QE-22, No. 9, Sept. 1986, pp. 1682-1694.)

Significantly, semiconductor lasers employing doping superlattice active layers exhibit tunable, spontaneous emission. That is, when such a laser is (uniformly) optically or electrically pumped, at levels which are below those needed to achieve stimulated emission, it is believed that the resulting electron-hole pairs produced in the intrinsic semiconductor material of the active layer serve to screen (compensate) the dopants in the dopant sheet and, as a result, reduce the degree of band diagram modulation produced by the dopant sheets. Moreover, the greater the intensity of the pumping excitation, the greater is the screening effect. As a consequence, by varying the intensity of the pumping excitation, the wavelength of the spontaneous emission is readily changed. However, artisans working in the field have asserted that at the threshold levels needed to achieve stimulated emission, the density of electron-hole pairs becomes so high that the band diagram modulation produced by the dopant sheets is completely eliminated, i.e., the valence and conduction bands are completely flat. Consequently, it has been concluded that the wavelength of the stimulated emission cannot be tuned. (See E. F. Schubert et al, "GaAs Sawtooth Superlattice Laser Emitting at Wavelengths $\lambda > 0.9$ $\mu$m," *Applied Physics Letters*, 47(3), Aug. 1, 1985, pp. 219-221; and B. A. Vojak et al, "Photopumped Laser Operation of GaAs Doping Superlattices," *Applied Physics Letters*, Vol. 48, No. 3, Jan. 20, 1986, pp. 251-253.)

Thus, those engaged in developing optical systems employing wavelength-tunable semiconductor lasers have sought, thus far without success, tunable semiconductor lasers having a wavelength tuning range greater than 116 Angstroms.

SUMMARY OF THE INVENTION

The invention involves the finding that semiconductor lasers which include doping superlattice active layers are readily tuned by nonuniformly, optically and/or electrically pumping these lasers. That is, during pumping, at least one region of the active layer of such a laser, having a volume which is at least ten percent, but no more than ninety percent, that of the active layer, should be pumped to an average excitation level which is below that needed to achieve stimulated emission in the region. (A region which is not at all pumped falls within this category.) By contrast, another region of the active layer, also having a volume which is at least ten percent that of the active layer, should be pumped to an average excitation level which is at least ten percent higher than the above excitation level, and high enough to achieve sufficient stimulated emission to produce lasing. (Various combinations of regions subjected to relatively high and relatively low average excitation levels, e.g., interdigitated such regions, are also useful.) Significantly, by varying the volume of the region (or regions) subjected to relatively low average excitation levels (with the total volume of the region or regions being constrained by the volumetric percentage limits, given above) and/or by varying these relatively low average excitation levels, and by correspondingly varying the pumping intensities applied to the other regions, the wavelength of the emitted laser light is readily varied.

By way of explanation, the larger the volume of the region (or regions) subjected to a relatively low excitation level and/or the lower the level of the relatively low excitation level, the higher the pumping intensity which must be applied to the other region (or regions) to achieve lasing, and vice versa. Stated alternatively, the larger the volume of the former region (or regions) and/or the lower the level of the relatively low excitation level, the higher the threshold number density of electron-hole pairs which must be formed in, or injected into, the latter region (or regions) to achieve lasing. But these electron-hole pairs serve to screen the dopants in the dopant sheets, and thus reduce the degree of band diagram modulation produced by the dopant sheets. However, it has been found that the amount of screening produced by the threshold number density of electron-hole pairs associated with the present invention does not, in general, produce a complete flattening of the valence and conduction bands. As a consequence, tunability is readily achieved.

Significantly, in the case of a semiconductor laser having a doping superlattice active layer in which the intrinsic semiconductor material is GaAs, and the n-type and p-type dopants in the dopant sheets are, respectively, silicon and beryllium, it has been found that non-uniform pumping permits tunability over a wavelength range which is larger than 116 Angstroms, even larger than 200 Angstroms, and even as large as 250 Angstroms.

BRIEF DESCRIPTION OF THE DRAWING(S)

The invention is described with reference to the accompanying drawings, wherein:

FIGS. 1 and 2 diagrammatically depict, respectively, a WDM optical system and a LAN, encompassed by the present invention;

FIG. 3 includes a perspective drawing of a semiconductor laser, including a doping superlattice active layer, encompassed by the present invention, and FIG. 3A shows sketches of the (idealized) doping profile along the growth axis, Z, of the active layer and the corresponding band diagram;

FIG. 4 depicts a technique for achieving nonuniform, optical pumping of the semiconductor laser depicted in FIG. 3; and FIG. 5 depicts a technique for achieving nonuniform, electrical pumping of the semiconductor laser depicted in FIG. 3.

DETAILED DESCRIPTION

The invention encompasses optical systems, e.g., optical fiber communication systems, each of which includes at least one particular type of wavelength-tunable semiconductor laser, described below, and at least one photodetector capable of optical communication with the laser. In addition, the invention encompasses a method for communicating information via the inventive optical systems, this method including a technique for tuning the laser.

Figure 1:
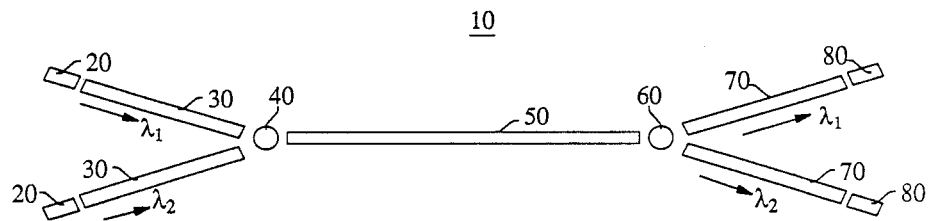

With reference to FIG. 1, an optical communication system encompassed by the present invention is a WDM system 10 including two or more spatially separated, wavelength-tunable semiconductor lasers 20 (described below) which, in operation, emit laser radiation at, respectively, wavelengths $\lambda_1$ and $\lambda_2$. The system 10 also includes two or more optical fibers 30 and a multiplexer 40, the fibers 30 serving to communicate the laser beams emitted by the lasers 20 to the multiplexer 40, which spatially combines the laser beams. The system 10 further includes an optical fiber 50, which communicates the spatially combined laser beams to a demultiplexer 60, which spatially separates the two laser beams. Optical fibers 70 serve to communicate the spatially separated laser beams to photodetectors 80.

Figure 2:
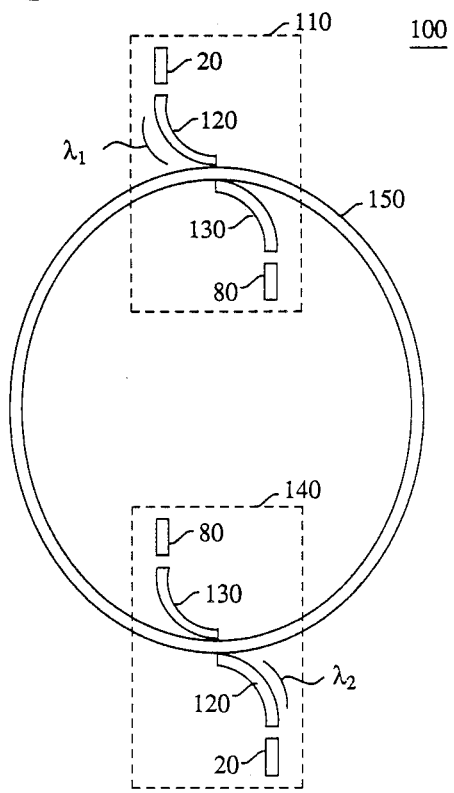

With reference to FIG. 2, a second optical communication system encompassed by the present invention is a LAN 100 including two or more stations 110 and 140, e.g., two or more computers or computer terminals, which communicate with each other via an optical fiber bus 150. Each station includes a wavelength-tunable semiconductor laser 20 which, in operation, emits laser radiation at a unique, station-identifying wavelength, e.g., $\lambda_1$ or $\lambda_2$. Each station also includes an optical coupler 120, which serves to couple at least a portion of the laser radiation emitted by the corresponding laser into the optical fiber bus 150. Each station further includes a second optical coupler 130 and a photodetector 80, the coupler 130 serving both to couple laser radiation out of the optical fiber bus and to communicate it to the detector 80.

Figure 3:
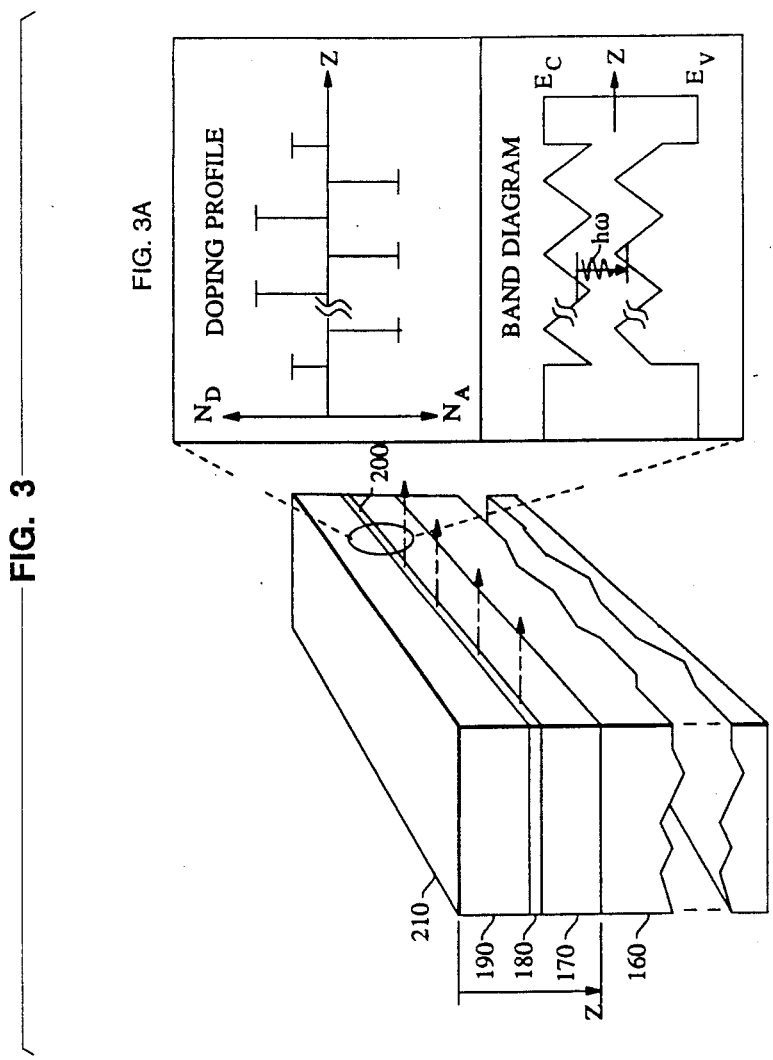

With reference to FIG. 3, the wavelength-tunable semiconductor laser 20, employed in the inventive optical systems, includes a doping superlattice active layer 180, preferably sandwiched between lower-refractive-index layers 170 and 190, all grown on a substrate 160, e.g., a semi-insulating substrate 160. (By virtue of its relatively high refractive index, compared to that of the layers 170 and 190, light is confined to, and guided by, the active layer 180.) The layers comprising the laser are readily epitaxially grown on the substrate 160 using conventional techniques such as molecular beam epitaxy (MBE) or metal organic chemical vapor deposition (MOCVD) techniques. After growth, the layers are cleaved to form the mirror-like end surfaces 200 and 210, essential to the proper operation of the laser.

The intrinsic semiconductor material of the active layer 180 has a composition which includes III–V compound semiconductor material. To achieve epitaxial growth, the compositions of the layers 170 and 190, as well as that of the substrate 160, also include such material. For example, if the composition of the layer 180 includes GaAs, then, to achieve epitaxial growth and a reduced refractive index, the compositions of the layers 170 and 190 include, for example, $Al_xGa_{1-x}As$ ($0.1 \leq x \leq 1.0$), and that of the substrate 160 includes GaAs. On the other hand, if the composition of the layer 180 includes InP, then those of the layers 170 and 190 include, for example, $Ga_yIn_{1-y}As$ (where y is, for example, 0.47) and that of the substrate 160 includes InP.

The thickness of the doping superlattice active layer 180 ranges from about 20 nanometers(nm) to about 500 nm. Thicknesses less than about 20 nm are undesirable because such thicknesses make it difficult to incorporate at least one sheet of n-type dopant and at least one sheet of p-type dopant into the active layer, which is essential to the proper operation of the laser 20 (as discussed more fully below). Thicknesses greater than about 500 nm, while not precluded, are undesirable because such thicknesses result in relatively low photon densities within the active layer, and thus impose the need to use relatively high pumping intensities to achieve lasing.

If, for example, the intrinsic semiconductor material of the doping superlattice active layer 180 includes GaAs, then n-type dopants useful in the n-type dopant sheets include Si, Sn and Te. The p-type dopants useful in the p-type dopant sheets include Be, Zn, Cd and C.

The dopant sheets of the active layer 180 are, of course, incorporated into the active layer during the growth process. The resulting doping profile within the active layer, along the growth axis, Z, of the active layer, is depicted in FIG. 3A in an idealized fashion, where $N_D$ and $N_A$ denote the number density of, respectively, donor ions and acceptor ions. The corresponding band diagram modulation produced by the presence of the dopant sheets is also depicted in the figure.

As is evident from FIG. 3A, the presence of the dopant sheets produces a sawtooth-shaped modulation of the band diagram, and it is this modulation which makes tunability possible. That is, during nonuniform pumping, described below, the resulting electrons which are formed in, or injected into, the active layer become trapped in the quantum wells formed by the valleys in the (modulated) conduction band. In addition, the holes which are formed in, or injected into, the active layer become trapped in the quantum wells formed by the peaks in the (modulated) valence band. Significantly, the energy gap between the energy levels occupied by these electrons and holes is less than the band gap. As a consequence, when these electrons and holes undergo stimulated recombination, the wavelength of the resulting stimulated emission is longer than that associated with the band gap. By reducing the degree of band diagram modulation (achieved by increasing the number density of electron-hole pairs formed in, or injected into, the active layer), the wavelength of the stimulated emission is also reduced.

To achieve at least one "valley" in the conduction band and at least one "peak" in the valence band, the active layer 180 should include at least one n-type dopant sheet and at least one p-type dopant sheet. On the other hand, the active layer 180 preferably includes no more than twenty pairs of n-type and p-type dopant sheets because a greater number of such pairs produces undesirably small "valleys" and "peaks" in the conduction and valence bands.

As depicted in FIG. 3, the dopant sheets are pictured, ideally, as having infinitesimally small thicknesses. In fact, the sheets have finite thicknesses, and the doping profiles are typically gaussian in shape. In this regard, the full-width-at-half-maximum widths of these gaussian distributions is typically 1-2 nm. Moreover, the mean distance, d, between dopant ions in a dopant sheet is approximately given by $$d \approx 1/\sqrt{N^{2d}},$$

where $N^{2d}$ denotes the number of dopant ions per unit area in the central planes of the gaussian distributions. Significantly, it has been found that $N^{2d}$ should be equal to or greater than about $10^{12} cm^{-2}$. Values of $N^{2d}$ less than about $10^{12} cm^{-2}$ are undesirable because they result in an undesirably small modulation of the valence and conduction bands. As a consequence, d is necessarily equal to or less than about 10 nm.

In order to achieve the sawtooth-shaped modulation of the band diagram depicted in FIG. 3A, the distance, $d_s$, between the center planes of adjacent dopant sheets should be greater than d, and thus, for example, greater than about 10 nm. Values of $d_s$ less than about 10 nm are less desirable because they produce relatively weak, smoothly varying sinusoidal modulations of the band diagram which generally preclude tunability.

The periodic spacing between the n-type dopant sheets and between the p-type dopant sheets ranges from about 20 nm to about 100 nm. Periodic spacings less than about 20 nm imply that the distance, $d_s$, between adjacent n-type and p-type dopant sheets is less than about 10 nm, which is undesirable for the reason given above. Periodic spacings greater than about 100 nm are undesirable because the distance between adjacent quantum wells (the "valleys" and "peaks") for electrons and holes is undesirably large, which results in an undesirably low recombination efficiency.

As discussed above, it has been found that the semiconductor laser 20 is readily tuned by nonuniformly, optically and/or electrically pumping the laser. To achieve the nonuniform pumping encompassed by the present invention, at least one region of the active layer 180 of the laser 20, having a volume which is at least ten percent that of the active layer, should be pumped to an average excitation level (averaged over the volume of the region) which is below that needed to achieve stimulated emission in this region. (A region which is not at all pumped falls within this category). The volume of this region should be no more than about ninety percent that of the active layer, because otherwise the pumping excitation which must be applied to the remainder of the active layer becomes impractically large.

Nonuniform pumping also implies that at least one other region of the active layer 180, also having a volume which is at least ten percent that of the active layer, should be pumped to an average excitation level which is at least ten percent higher than the above excitation level, and high enough to achieve sufficient stimulated emission to achieve lasing.

It should be noted that the nonuniform pumping encompassed by the present invention also encompasses subjecting three or more regions of the active layer to various combinations of average excitation levels, e.g., relatively low, followed by relatively high, followed by relatively low excitation levels or relatively high, followed by relatively low, followed by relatively high excitation levels. The only constraint on these various combinations is that the total volume of the regions subjected to a relatively low excitation level fall within the limits given above, and that the total volume of the regions subjected to a relatively high excitation level meet the condition, given above.

Figure 4:
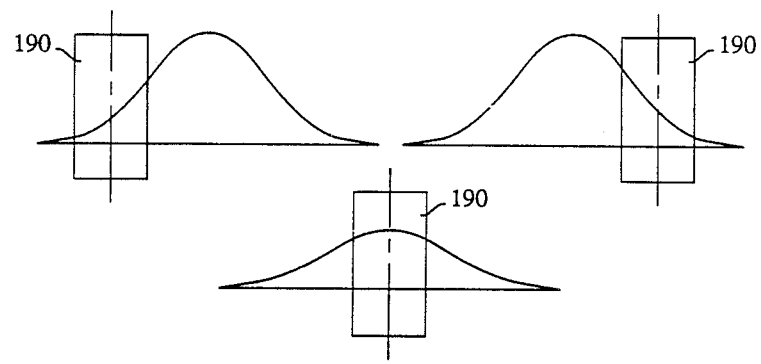
Figure 5:
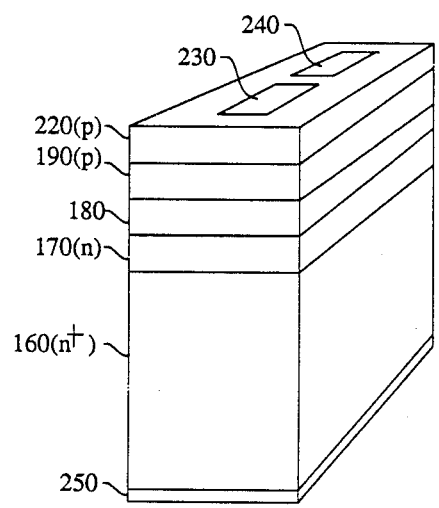

The nonuniform pumping, described above, is readily achieved by, for example, pumping the laser 20 with an optical beam having a gaussian-shaped intensity distribution and displacing the center of the beam from the center of the laser, as depicted in FIG. 4. As a consequence, two regions are defined, one of which is subjected to a relatively low, average excitation level and the other of which is subjected to a relatively high, average excitation level. Alternatively, nonuniform pumping is achieved by, for example, forming the substrate 160 (see FIG. 5) to be of n+-type conductivity, forming the layer 170 to be of n-type conductivity, forming the layer 190 to be of p-type conductivity, and growing an additional layer 220 (of III-V compound semiconductor material) of p-type conductivity on the layer 190. Then, by forming two (or more) electrical contacts 230 and 240 on the surface of the layer 220, as well as an electrical contact 250 on the lower surface of the substrate 160, a relatively low amount of current is readily flowed through, for example, contact 230 and a relatively large amount of current is flowed through contact 240 to achieve the desired, nonuniform pumping.

As noted above, the semiconductor laser 20 is readily tuned by adjusting the volume of the region (or regions) of the active layer subjected to a relatively low excitation level and/or by adjusting the level of the relatively low excitation level. This is readily achieved, for example, by shifting the center of the gaussian-shaped pumping beam depicted in FIG. 4 relative to the center of the laser until the desired emission wavelength is obtained. Alternatively, tuning is achieved by adjusting the magnitudes of the currents flowing through the two or more electrodes 230 and 240 depicted in FIG. 5.

Significantly, it has been found that if the intrinsic semiconductor material in the active layer 180 includes GaAs, if the n-type and p-type dopants in the dopant sheets are, respectively, Si and Be, if the active layer includes five pairs of n-type and p-type dopant sheets with a periodic spacing (between n-type dopant sheets and between p-type dopant sheets) of 38 nm, then the laser 20 is capable of being tuned over a wavelength range as large as 200 Angstroms, and even as large as 250 Angstroms.

We claim:

1. An optical system, comprising:
at least one wavelength-tunable source of laser radiation, said source including a semiconductor laser comprising an active layer sandwiched between first and second layers of material having a lower refractive index than that of said active layer, said active layer having a composition which includes III-V compound semiconductor material; and
at least one photodetector, capable of optical communication with said source, characterized in that
said active layer includes at least one layer of n-type dopant and at least one layer of p-type dopant, and said source further includes means for optically and/or electrically, nonuniformly pumping said active layer, the degree of nonuniformity being such that the resulting, average excitation level in at least a first region of said active layer is at least ten percent higher than that in a second region of said active layer, the average excitation level in said second region being less than the threshold level needed to achieve stimulated emission in said second region.

2. The optical system of claim 1, wherein said second region has a volume which is at least ten percent that of said active layer.

3. The optical system of claim 1, wherein said first region has a volume which is at least ten percent that of said active layer.

4. An optical system, comprising:
at least first and second wavelength-tunable sources of laser radiation, said first source including a first semiconductor laser comprising a first active layer sandwiched between layers of material having a lower refractive index than that of said first active layer and said second source including a second semiconductor laser comprising a second active layer sandwiched between layers of material having a lower refractive index than that of said second active layer, each of said first and second active layers having a composition which includes III-V compound semiconductor material; and
at least first and second photodetectors, each of said photodetectors being capable of optical communication with one of said sources, characterized in that
each of said first and second active layers includes at least one layer of n-type dopant and at least one layer of p-type dopant, and
said first source further includes first means for optically and/or electrically, nonuniformly pumping said first active layer, the degree of nonuniformity being such that the average excitation level in at least a first region of the first active layer, having a volume which is at least ten percent that of the first active layer, is less than the threshold level needed to achieve stimulated emission in said first region, and said second source further includes second means for optically and/or electrically, nonuniformly pumping said second active layer, the degree of nonuniformity being such that the average excitation level in at least a second region of the second active layer, having a volume which is at least ten percent that of the second active layer, is less than the threshold level needed to achieve stimulated emission in said second region, the volumes of said first and second regions, as percentages of, respectively, said first and second active layers, and/or the average excitation levels in said first and second regions, being different from one another.

5. An optical system, comprising:
at least one wavelength-tunable source of laser radiation, said source including a semiconductor laser comprising an optically active region and means for optically and/or electrically pumping said laser; and
at least one photodetector, capable of optical communication with said source, characterized in that:
said means for pumping said laser comprises means for nonuniformly pumping said optically active region; and
said source responsive to nonuniform pumping is capable of being tuned over a wavelength range greater than 116 Angstroms.

* * * * *